United States Patent
Wakatsuki et al.

(10) Patent No.: US 11,127,681 B2
(45) Date of Patent: Sep. 21, 2021

(54) THREE-DIMENSIONAL MEMORY INCLUDING MOLYBDENUM WIRING LAYER HAVING OXYGEN IMPURITY AND METHOD FOR MANUFACTURING THE SAME

(71) Applicant: Toshiba Memory Corporation, Tokyo (JP)

(72) Inventors: Satoshi Wakatsuki, Yokkaichi Mie (JP); Katsuaki Natori, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 152 days.

(21) Appl. No.: 16/280,003

(22) Filed: Feb. 19, 2019

(65) Prior Publication Data

US 2020/0091080 A1     Mar. 19, 2020

(30) Foreign Application Priority Data

Sep. 18, 2018 (JP) ............... JP2018-173549

(51) Int. Cl.
*H01L 23/532* (2006.01)
*H01L 27/11582* (2017.01)
*H01L 21/28* (2006.01)

(52) U.S. Cl.
CPC .. *H01L 23/53257* (2013.01); *H01L 27/11582* (2013.01); *H01L 29/40117* (2019.08)

(58) Field of Classification Search
CPC ......... H01L 23/53257; H01L 27/11582; H01L 29/40117
See application file for complete search history.

(56) References Cited

U.S. PATENT DOCUMENTS

| | | | |
|---|---|---|---|
| 5,913,100 A * | 6/1999 | Kohsaka | ................. C22C 27/04 428/546 |
| 6,472,754 B2 | 10/2002 | Nakajima et al. | |
| 8,922,018 B2 | 12/2014 | Ishizaki et al. | |
| 9,018,764 B2 | 4/2015 | Sakata et al. | |
| 2012/0306081 A1* | 12/2012 | Ishizaki | ............... H01L 21/764 257/751 |
| 2017/0040416 A1* | 2/2017 | Ota | .................... H01L 27/11575 |
| 2017/0278859 A1* | 9/2017 | Sharangpani | ..... H01L 27/11582 |
| 2019/0067003 A1* | 2/2019 | Zope | .................... H01L 21/0228 |
| 2019/0067014 A1* | 2/2019 | Shrestha | ........... H01L 21/32135 |

* cited by examiner

*Primary Examiner* — Lex H Malsawma
(74) *Attorney, Agent, or Firm* — Foley & Lardner LLP (57) ABSTRACT

A semiconductor device includes a substrate. The semiconductor device further includes a wiring layer provided on the substrate, the wiring layer including a molybdenum layer including oxygen atoms as an impurity.

16 Claims, 7 Drawing Sheets

THREE-DIMENSIONAL MEMORY INCLUDING MOLYBDENUM WIRING LAYER HAVING OXYGEN IMPURITY AND METHOD FOR MANUFACTURING THE SAME

CROSS-REFERENCE TO RELATED APPLICATION

This application claims the benefit of and priority to Japanese Patent Application No. 2018-173549, filed Sep. 18, 2018, the entire contents of which are incorporated herein by reference.

FIELD

Embodiments described herein relate generally to a semiconductor device and a method for manufacturing the same.

BACKGROUND

To reduce a resistance of a word line in a three-dimensional memory, a word line may be formed with use of a low-resistance metal. However, depending on types of metals to be used, a problem may arise in that, for example, the particle diameter of a crystal grain in the word line becomes small. This may also occur in the case of forming a semiconductor device other than the three-dimensional memory or the case of forming a wiring layer using lines other than the word line.

DETAILED DESCRIPTION

Embodiments described herein provide for a semiconductor device including a low-resistance wiring layer and a method for manufacturing the same.

In general, according to one embodiment, a semiconductor device includes a substrate. The semiconductor device further includes a wiring layer provided on the substrate, the wiring layer including a molybdenum layer including oxygen atoms as an impurity.

Hereinafter, embodiments of the present disclosure will be described with reference to the drawings. In FIG. 1 to FIG. 7, the same or similar constituent elements may be assigned the respective same reference characters, and the redundant description thereof is omitted.

First Embodiment

Figure 1:
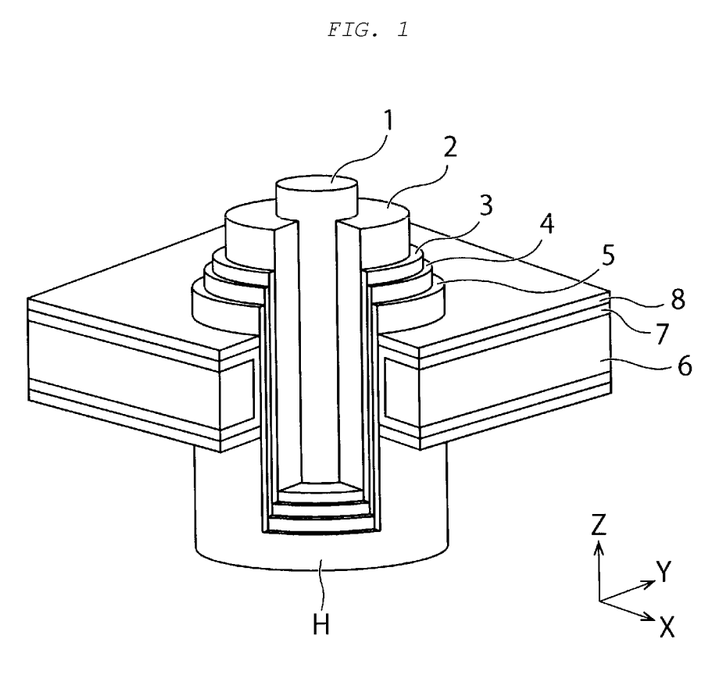
FIG. 1 is a perspective view illustrating a structure of a semiconductor device according to a first embodiment.

FIG. 1 is a perspective view illustrating a structure of a semiconductor device according to a first embodiment. The semiconductor device illustrated in FIG. 1 is, for example, a three-dimensional memory.

The semiconductor device illustrated in FIG. 1 includes a core insulating film 1, a channel semiconductor layer 2, a tunnel insulating film 3, a charge storage layer 4, a block insulating film 5, an electrode material layer 6, a first metal layer 7, and a second metal layer 8.

Referring to FIG. 1, a plurality of electrode layers and a plurality of insulating layers are alternately formed on a substrate, and a memory hole H is provided in the electrode layers and insulating layers. FIG. 1 indicates an X-direction and a Y-direction, which are parallel to the surface of the substrate and are perpendicular to each other, and a Z-direction, which is perpendicular to the surface of the substrate. In the present specification, the plus Z-direction is referred to as an upward direction, and the minus Z-direction is referred to as a downward direction. The minus Z-direction may coincide with the direction of gravitational force, but does not need to coincide with the direction of gravitational force. As illustrated in FIG. 1, each electrode layer is configured with the electrode material layer 6, the first metal layer 7, and the second metal layer 8, and functions as a control electrode (word line).

The core insulating film 1, the channel semiconductor layer 2, the tunnel insulating film 3, the charge storage layer 4, and the block insulating film 5 are formed inside the memory hole H, and configure a memory cell. The block insulating film 5 is formed on the surfaces of the electrode layers and insulating layers inside the memory hole H, and the charge storage layer 4 is formed on the surface of the block insulating film 5. The tunnel insulating film 3 is formed on the surface of the charge storage layer 4, and the channel semiconductor layer 2 is formed on the surface of the tunnel insulating film 3. The core insulating film 1 is embedded in the channel semiconductor layer 2. The channel semiconductor layer 2, the tunnel insulating film 3, the charge storage layer 4, and the block insulating film 5 are sequentially formed around the core insulating film 1 in such a way as to surround the core insulating film 1.

The block insulating film 5 includes a stacked film including an aluminum oxide film ($Al_2O_3$ film) and a silicon oxide film ($SiO_2$ film). The charge storage layer 4 includes, for example, a silicon nitride film (SiN film). The tunnel insulating film 3 includes, for example, an $SiO_2$ film. The channel semiconductor layer 2 includes, for example, a polysilicon layer. The core insulating film 1 includes, for example, an $SiO_2$ film.

The electrode material layer 6, the first metal layer 7, and the second metal layer 8 includes, for example, a molybdenum layer (Mo layer), a titanium nitride film (TiN film), and an $Al_2O_3$ film, respectively. In this case, the first metal layer 7 functions as a barrier metal layer in each electrode layer, and the second metal layer 8 functions as a block insulating film in conjunction with the block insulating film 5. The electrode material layer 6 in the present embodiment is an Mo layer including oxygen atoms as an impurity. The concentration of oxygen atoms in the electrode material layer 6 is, for example, in a range of about $1.0 \times 10^{20}$ atoms/$cm^3$ to about $5.0 \times 10^{22}$ atoms/$cm^3$. The average particle diameter of crystal grains in any area in the electrode material layer 6 is, for example, about 25 nanometers (nm) or more (e.g., about 30 nm or more, or about 35 nm or more). Furthermore, the semiconductor device in the present embodiment may omit the first metal layer 7.

FIGS. 2A and 2B to FIGS. 4A and 4B are sectional views illustrating a method for manufacturing a semiconductor device according to the first embodiment.

Figure 2A:
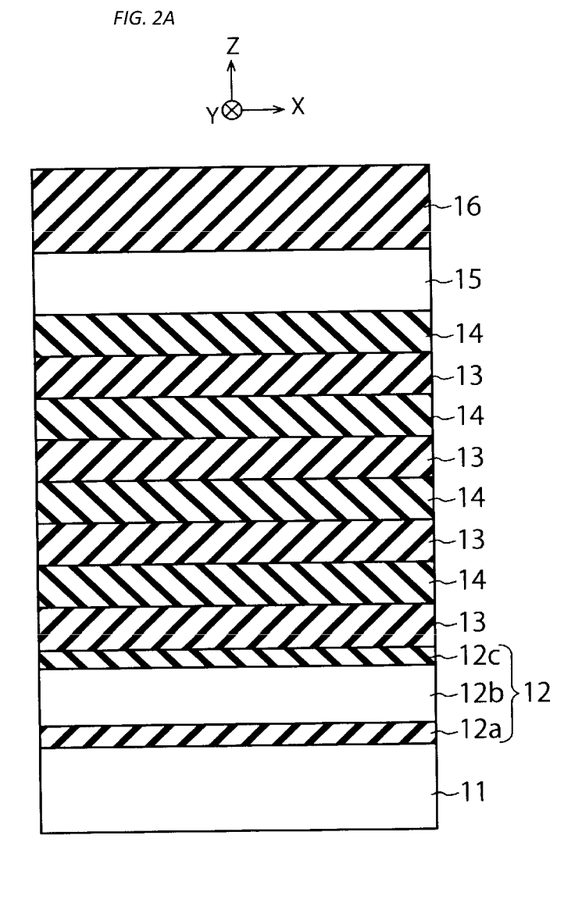
FIGS. 2A and 2B are sectional views illustrating a method for manufacturing a semiconductor device according to the first embodiment.

First, the method includes forming an under layer 12 on a substrate 11, forming a stacked film, which includes a plurality of sacrifice layers 13 and a plurality of insulating layers 14 arranged alternately, on the under layer 12, and forming a semiconductor layer 15 and an interlayer insulating film 16 on the stacked film, as illustrated in FIG. 2A. The sacrifice layer 13 is an example of a first film.

The substrate 11 is, for example, a semiconductor substrate such as a silicon substrate. The under layer 12 includes a first insulating film 12a, a semiconductor layer 12b, and a second insulating film 12c, which are sequentially formed on the substrate 11. The first insulating film 12a is, for example, an $SiO_2$ film. The semiconductor layer 12b is, for example, a polysilicon layer, and functions as a selection gate. The second insulating film 12c is, for example, an $SiO_2$ film. The sacrifice layer 13 is, for example, an SiN film. The insulating layer 14 is, for example, an $SiO_2$ film. The semiconductor layer 15 is, for example, a polysilicon layer, and functions as a selection gate. The interlayer insulating film 16 is, for example, an $SiO_2$ film.

Figure 2B:
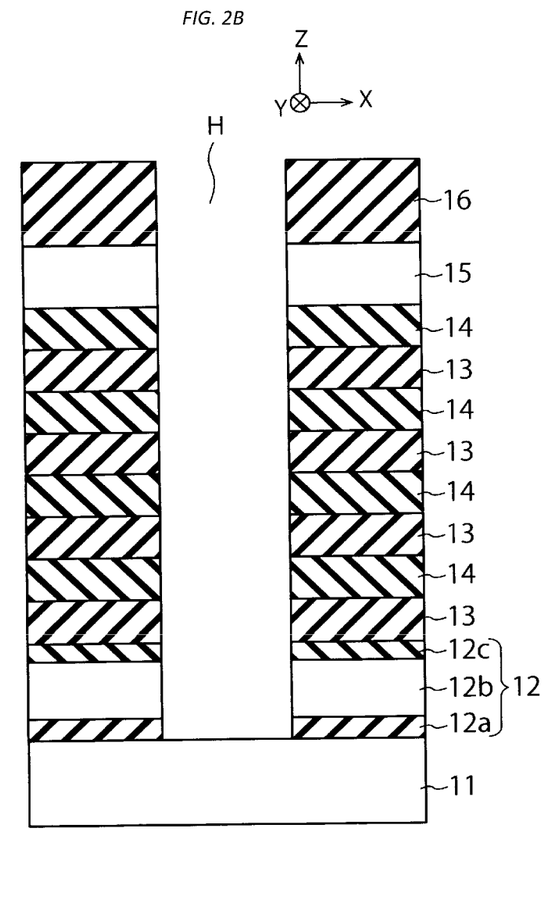

Next, the method includes forming a memory hole H, which penetrates through the interlayer insulating film 16, the semiconductor layer 15, the plurality of insulating layers 14, the plurality of sacrifice layers 13, and the under layer 12, as illustrated in FIG. 2B.

Figure 3A:
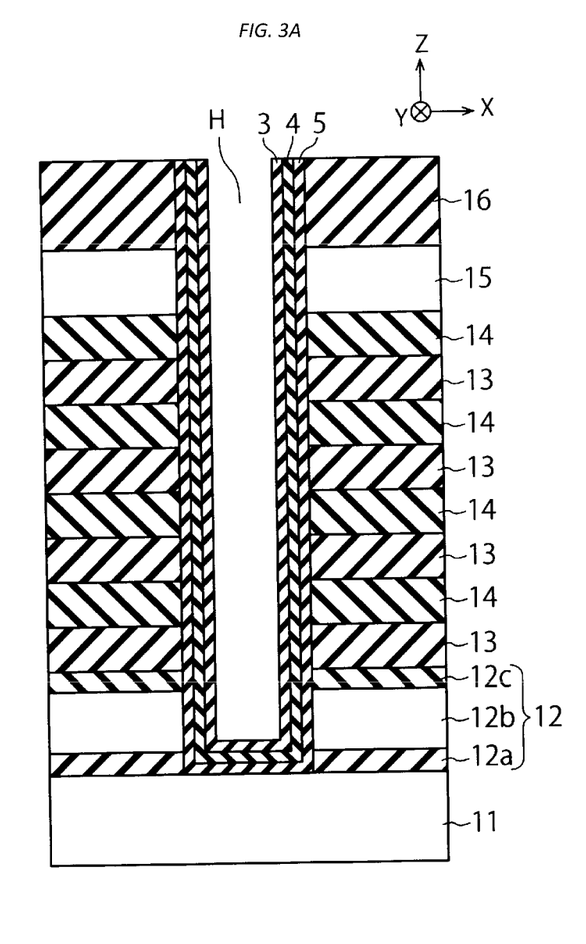
FIGS. 3A and 3B are sectional views illustrating the method for manufacturing a semiconductor device according to the first embodiment.

Next, the method sequentially forms the block insulating film 5, the charge storage layer 4, and the tunnel insulating film 3 on the surfaces of the under layer 12, the sacrifice layers 13, the insulating layers 14, the semiconductor layer 15, and the interlayer insulating film 16 inside the memory hole H, as illustrated in FIG. 3A.

Figure 3B:
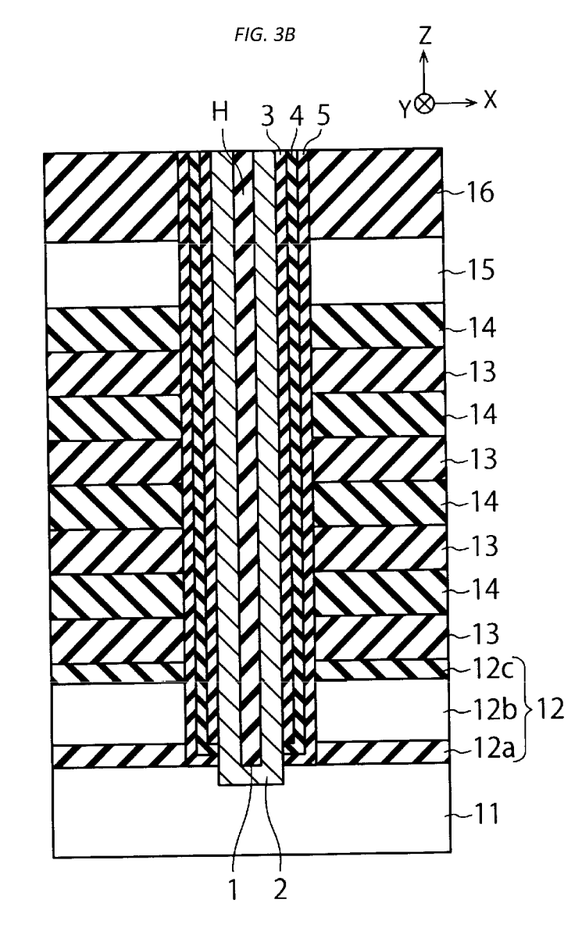

Next, the method includes removing portions of the tunnel insulating film 3, the charge storage layer 4, and the block insulating film 5 disposed at the bottom of the memory hole H, as illustrated in FIG. 3B. This causes the substrate 11 to be exposed in the memory hole H. Next, the method includes sequentially forming the channel semiconductor layer 2 and the core insulating film 1 inside the memory hole H, as illustrated in FIG. 3B.

Figure 4A:
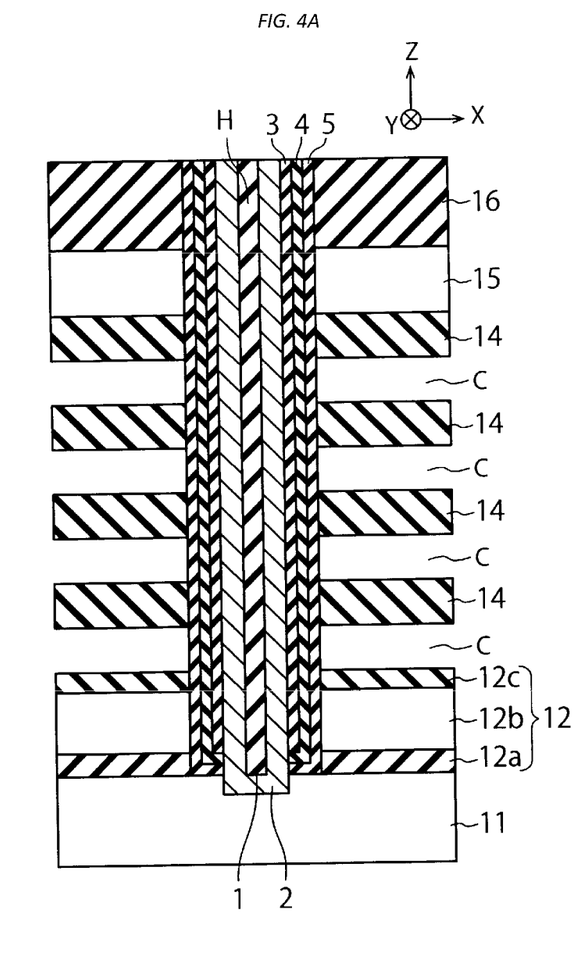
FIGS. 4A and 4B are sectional views illustrating the method for manufacturing a semiconductor device according to the first embodiment.

Next, the method includes forming grooves (not illustrated) in the sacrifice layers 13 and the insulating layers 14, and includes removing the sacrifice layers 13 with a chemical solution of, for example, phosphoric acid using the formed grooves, as illustrated in FIG. 4A. As a result, a plurality of cavities C are respectively formed between the insulating layers 14. The cavity C is an example of a recess portion.

Figure 4B:
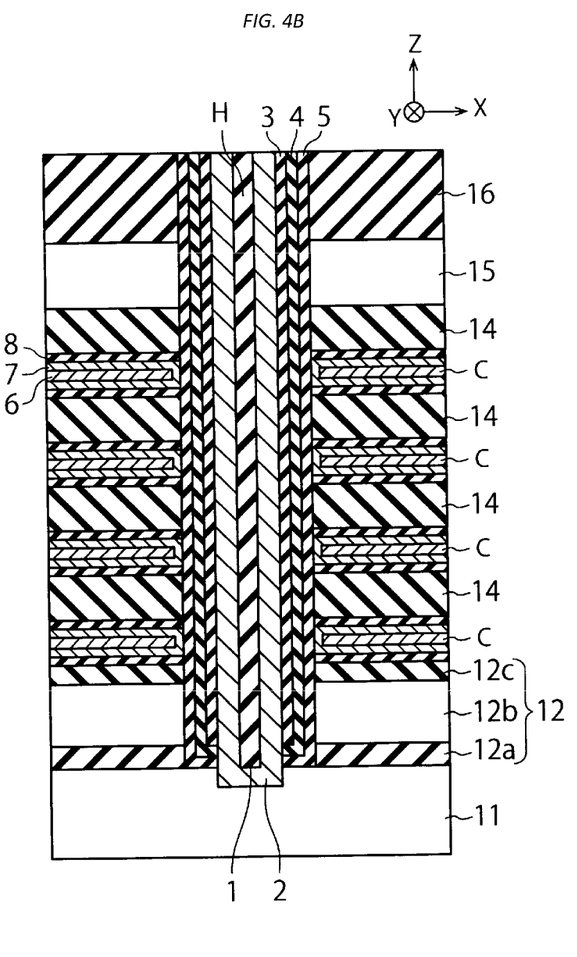

Next, the method includes sequentially forming the second metal layer 8, the first metal layer 7, and the electrode material layer 6 inside each of the cavities C, as illustrated in FIG. 4B. As a result, a plurality of electrode layers are respectively formed inside the cavities C. However, before forming the first metal layer 7, the method may include removing a portion of the second metal layer 8 corresponding to the side surface of the block insulating film 5. The electrode material layer 6 includes, for example, an Mo layer including oxygen atoms as an impurity, and is formed by chemical vapor deposition (CVD). In this way, the semiconductor device illustrated in FIG. 1 is manufactured.

Furthermore, in the process illustrated in FIG. 2A, the method may include forming, on the under layer 12, a stacked film which includes a plurality of electrode layers and a plurality of insulating layers 14 arranged alternately one by one. The electrode layers are formed in such a manner as to include, for example, electrode material layers 6, as mentioned above. In this case, the processes illustrated in FIG. 4A and FIG. 4B may be omitted.

Details of the method for forming the electrode material layer 6 are described below.

The electrode material layer 6 is formed in a range of about 400° C. to about 750° C. using $MoCl_5$ gas as a raw material gas and $H_2$ gas as a reducing gas (Cl representing chlorine and H representing hydrogen). The electrode material layer 6 is formed by sequentially and repeatedly supplying $MoCl_5$ gas, purge gas, $H_2$ gas, and purge gas to the inside of a CVD chamber for forming the electrode material layer 6. Examples of purge gas include argon (Ar) gas and nitrogen ($N_2$) gas. As a result, an Mo layer is formed as the electrode material layer 6.

Following the above processes, the method includes performing heating treatment for heating the electrode material layer 6 in an atmosphere containing oxygen. As a result, oxygen atoms are introduced from the atmosphere into the electrode material layer 6. Therefore, the electrode material layer 6 is an Mo layer including oxygen atoms as an impurity. In this case, adjusting the heating treatment temperature or oxygen partial pressure enables adjusting the concentration of oxygen atoms in the electrode material layer 6. In some embodiments, the concentration of oxygen atoms in the electrode material layer 6 be selected to be, for example, in a range of about $1.0 \times 10^{20}$ atoms/$cm^3$ to about $5.0 \times 10^{22}$ atoms/$cm^3$.

When oxygen atoms are introduced into the electrode material layer 6, as mentioned below, the particle diameter of crystal grain in the electrode material layer 6 becomes large, so that the resistance of the electrode material layer 6 becomes low. This enables reducing the resistance of a word line according to the present embodiment. It is desirable that the average particle diameter of crystal grains in a given area of the electrode material layer 6 be, for example, about 25 nm or more (e.g., about 30 nm or more, or about 35 nm or more).

FIGS. 5A, 5B, 5C, and 5D are diagrams used to explain crystal grains in the electrode material layer 6 in the first embodiment.

Figure 5A:
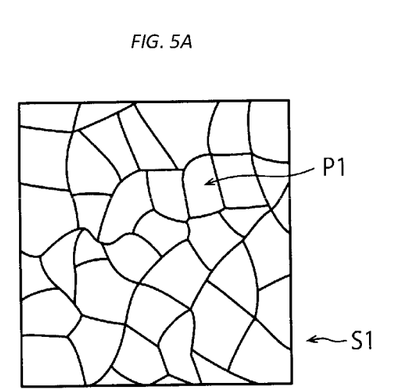
FIGS. 5A, 5B, 5C, and 5D are diagrams used to explain crystal grains in an electrode material layer according to the first embodiment.
Figure 5B:
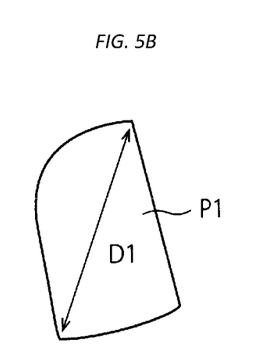

FIG. 5A illustrates a cross-section S1 of the electrode material layer 6 before oxygen atoms are introduced thereinto. Reference character P1 shown in FIG. 5A denotes a crystal grain in the cross-section S1. FIG. 5B illustrates the crystal grain P1 in an enlarged manner. Reference character D1 denotes the maximum dimension of the crystal grain P1 in the cross-section S1.

Figure 5C:
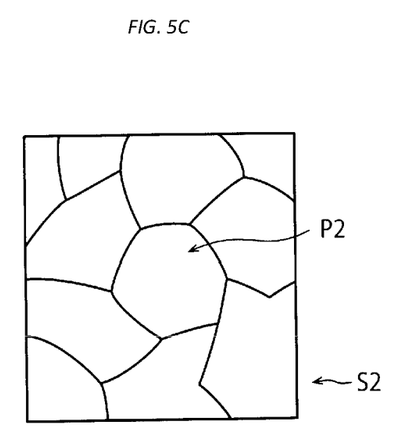
Figure 5D:
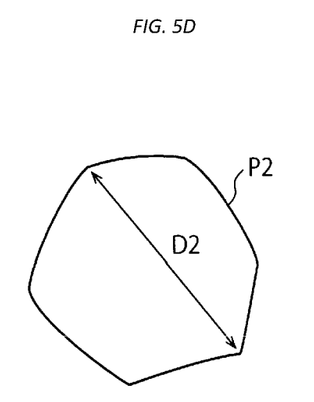

FIG. 5C illustrates a cross-section S2 of the electrode material layer 6 after oxygen atoms are introduced thereinto. Reference character P2 shown in FIG. 5C denotes a crystal grain in the cross-section S2. FIG. 5D illustrates the crystal grain P2 in an enlarged manner. Reference character D2 denotes the maximum dimension of the crystal grain P2 in the cross-section S2.

The particle diameter of the crystal grain P2 in the present embodiment is assumed to be the maximum dimension D2 of the crystal grain P2. For example, the particle diameter of the crystal grain P2 is able to be determined using a microscopic image of the cross-section S2 of the electrode material layer 6 and measuring the maximum dimension D2 of the crystal grain P2 in the cross-section S2.

Similarly, the particle diameter of the crystal grain P1 in the present embodiment is assumed to be the maximum dimension D1 of the crystal grain P1. These particle diameters are dimensions equivalent to the diameters of the respective crystal grains.

In the present embodiment, the average particle diameter of crystal grains in the electrode material layer 6 is able to be calculated by measuring the particle diameters of individual crystal grains in the cross-section S2 in a given area and calculating the average value of the particle diameters of these crystal grains. The average particle diameter of crystal grains in the electrode material layer 6 in the present embodiment is, for example, about 25 nm or more (e.g., about 30 nm or more, or about 35 nm or more) after oxygen atoms are introduced into the electrode material layer 6. Furthermore, the average particle diameter obtained before oxygen atoms are introduced into the electrode material layer 6 is, for example, about 20 nm.

Figure 6:
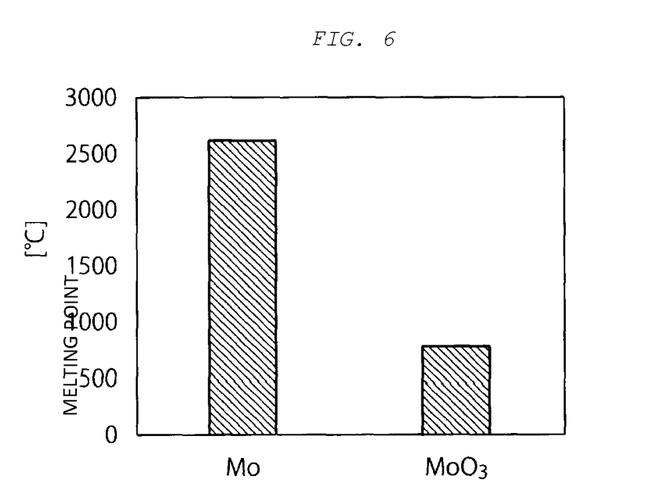
FIG. 6 is a graph used to explain an electrode material layer according to the first embodiment.

FIG. 6 is a graph used to explain the electrode material layer 6 according to the first embodiment.

FIG. 6 illustrates the melting point (2623° C.) of molybdenum (Mo) and the melting point (795° C.) of a molybdenum oxide ($MoO_3$). FIG. 6 shows that the melting point is lowered by adding oxygen to molybdenum. Moreover, it is known that, when the melting point is low, the crystal grain size can be increased by heat treatment. Therefore, according to the present embodiment, introducing oxygen atoms into the electrode material layer 6 enables decreasing the melting point of the electrode material layer 6. This enables increasing the particle diameter of crystal grain in the electrode material layer 6.

Figure 7:
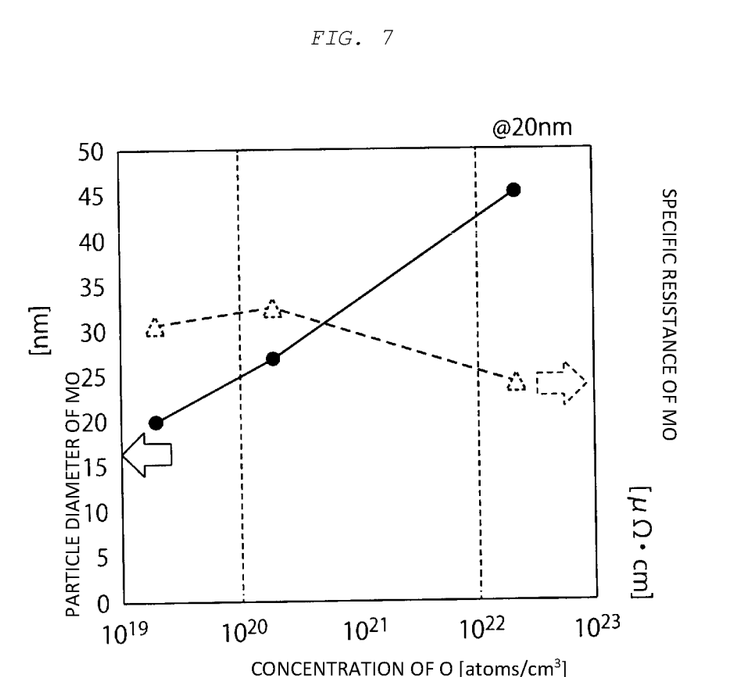
FIG. 7 is another graph used to explain the electrode material layer according to the first embodiment.

FIG. 7 is another graph used to explain the electrode material layer 6 according to the first embodiment.

The horizontal axis of FIG. 7 indicates the concentration of oxygen atoms (oxygen concentration) in the electrode material layer 6 (atoms per centimeter cubed). The vertical axes of FIG. 7 indicate the average particle diameter (denoted by a filled circle) of crystal grains in the electrode material layer 6 and the specific resistance (denoted by an unfilled dotted triangle) of the electrode material layer 6.

FIG. 7 shows that, as the oxygen concentration in the electrode material layer 6 increases, the average particle diameter increases and the specific resistance decreases. For example, if the oxygen concentration in the electrode material layer 6 is too low, the melting point of the electrode material layer 6 becomes high, the particle diameter of crystal grain becomes small, and the resistance of the electrode material layer 6 becomes high. Therefore, in the present embodiment, it is desirable that the oxygen concentration in the electrode material layer 6 be set high to some extent, for example, it is desirable that the oxygen concentration in the electrode material layer 6 be set to about $1.0 \times 10^{20}$ atoms/cm$^3$ or more.

On the other hand, if the oxygen concentration in the electrode material layer 6 is too high, the specific resistance becomes higher, so that the resistance of the electrode material layer 6 would increase. Therefore, in the present embodiment, it is desirable that the oxygen concentration in the electrode material layer 6 be not set too high, for example, it is desirable that the oxygen concentration in the electrode material layer 6 be set to about $5.0 \times 10^{22}$ atoms/cm$^3$ or less.

Details of a method for introducing oxygen atoms into the electrode material layer 6 are described as follows.

In the present embodiment, heating the electrode material layer 6 in an atmosphere containing oxygen is used to introduce oxygen atoms from the atmosphere into the electrode material layer 6. However, another method may be used to introduce oxygen atoms into the electrode material layer 6.

For example, after the first metal layer 7 (TiN film) is formed in the process illustrated in FIG. 4B, the substrate 11 may be exposed to air. As a result, the surface of the first metal layer 7 becomes oxidized, so that the surface of the first metal layer 7 comes to contain oxygen atoms. Next, when the electrode material layer 6 (Mo layer) is formed on the surface of the first metal layer 7, oxygen atoms on the surface of the first metal layer 7 diffuse to the electrode material layer 6. In this way, oxygen atoms are introduced from the first metal layer 7 into the electrode material layer 6.

Moreover, after the electrode material layer 6 (Mo layer) is formed in the process illustrated in FIG. 4B, the substrate 11 may be exposed in the air. As a result, the surface of the electrode material layer 6 becomes oxidized, so that the surface of the electrode material layer 6 comes to contain oxygen atoms. Next, when heating treatment for heating the electrode material layer 6 in an atmosphere containing Ar gas or $N_2$ gas is performed, oxygen atoms on the surface of the electrode material layer 6 diffuse to the inside of the electrode material layer 6. In this way, oxygen atoms are introduced into the electrode material layer 6. It is desirable that this heating treatment be performed at, for example, a temperature in a range of about 450° C. to about 900° C.

Introducing oxygen atoms into the electrode material layer 6 in any one of these methods enables increasing the particle diameter of crystal grain in the electrode material layer 6.

Moreover, at the time of formation and/or after formation of the electrode material layer 6, heating treatment for heating the electrode material layer 6 may be performed in an atmosphere containing hydrogen ($H_2$). This enables decreasing the concentration of oxygen atoms in the electrode material layer 6. This enables increasing the crystal grain size while adjusting oxygen atoms in the electrode material layer 6 to a desired concentration. It is desirable that this heating treatment be performed at, for example, a temperature in a range of about 450° C. to about 900° C.

In the above-described way, according to the present embodiment, the electrode material layer 6 is formed from an Mo layer, and oxygen atoms are introduced as an impurity into the Mo layer. This enables decreasing the melting point of the electrode material layer 6 by the introduction of oxygen atoms and enables increasing the particle diameter of crystal grain in the electrode material layer 6. Therefore, according to the present embodiment, it becomes possible to attain a low-resistance electrode material layer 6.

Furthermore, the method according to the present embodiment may be applied to a wiring layer other than the electrode material layer 6. For example, the method in the present embodiment may be applied to a wiring layer for forming wiring lines other than word lines, or may be applied to a wiring layer (for example, a plug material layer) for forming a contact plug or a via plug. Additionally, the method in the present embodiment may be applied to a wiring layer for various types of semiconductor devices other than three-dimensional memories.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
a substrate; and
a wiring layer provided on the substrate, the wiring layer including a molybdenum layer containing oxygen atoms as an impurity,
wherein a particle diameter of a crystal grain of the wiring layer increases to 25 nanometers (nm) or more through incorporating the oxygen atoms.

2. The semiconductor device according to claim 1, wherein a concentration of the oxygen atoms in the molybdenum layer is in a range of $1.0 \times 10^{20}$ atoms/centimeter $(cm)^3$ to $5.0 \times 10^{22}$ atoms/cm$^3$.

3. The semiconductor device according to claim 1, wherein the wiring layer comprises a plurality of electrode layers provided on the substrate, and the semiconductor device further comprises:
a plurality of insulating layers provided alternately with the plurality of electrode layers on the substrate;
a semiconductor layer embedded in the electrode layers and the insulating layers; and
a charge storage layer provided around the semiconductor layer.

4. The semiconductor device according to claim 1, wherein a concentration of the oxygen atoms in the molybdenum layer is greater than $1.0 \times 10^{20}$ atoms/cm$^3$.

5. The semiconductor device according to claim 1, wherein a concentration of the oxygen atoms in the molybdenum layer is less than $5.0 \times 10^{22}$ atoms/cm$^3$.

6. The semiconductor device according to claim 1, wherein the wiring layer further comprising a metal layer different from the molybdenum layer, the metal layer having oxygen atoms.

7. A method for manufacturing a semiconductor device, the method including forming a wiring layer on a substrate, the wiring layer comprising a molybdenum layer including oxygen atoms as an impurity by oxidizing a metal layer different from the molybdenum layer such that the oxygen atoms are introduced from the metal layer into the molybdenum layer.

8. The method for manufacturing a semiconductor device, according to claim 7, further comprising heating the molybdenum layer in an atmosphere containing oxygen such that the oxygen atoms are introduced into the molybdenum layer.

9. The method for manufacturing a semiconductor device, according to claim 7, further comprising oxidizing and heating the molybdenum layer such that the oxygen atoms are introduced into the molybdenum layer.

10. The method for manufacturing a semiconductor device, according to claim 7, further comprising, after forming the molybdenum layer including the oxygen atoms, decreasing a concentration of the oxygen atoms in the molybdenum layer.

11. The method for manufacturing a semiconductor device, according to claim 10, wherein decreasing concentration of the oxygen atoms in the molybdenum layer comprises heating the molybdenum layer in an atmosphere containing hydrogen.

12. The method for manufacturing a semiconductor device, according to claim 11, wherein the molybdenum layer is heated at a temperature in a range of 450° C. to 900° C. in the atmosphere containing hydrogen.

13. The method for manufacturing a semiconductor device, according to claim 11, wherein the concentration of the oxygen atoms in the molybdenum layer is decreased to no less than $1.0 \times 10^{20}$ atoms/cm$^3$.

14. The method for manufacturing a semiconductor device, according to claim 11, wherein the concentration of the oxygen atoms in the molybdenum layer is decreased to less than $5.0 \times 10^{22}$ atoms/cm$^3$.

15. The method for manufacturing a semiconductor device, according to claim 7, wherein forming the wiring layer comprises forming a plurality of electrode layers alternately stacked with a plurality of insulating layers on the substrate, and the method further comprises:
forming a semiconductor layer embedded in the electrode layers and the insulating layers; and
forming a charge storage layer embedded in the semiconductor layer, the electrode layers and the insulating layers.

16. The method for manufacturing a semiconductor device, according to claim 7, the method further comprising:
forming a plurality of first films alternately with a plurality of insulating layers on the substrate;
forming a charge storage layer in the first films and the insulating layers;
forming a semiconductor layer in the first films and the insulating layers;
removing the first films and forming a plurality of recess portions between the insulating layers; and
forming, as at least a portion of the wiring layer, a plurality of electrode layers in the recess portions.

* * * * *